United States Patent [19]
Heimlicher

[11] Patent Number: 6,031,430
[45] Date of Patent: *Feb. 29, 2000

[54] TEMPERATURE STABILIZED OSCILLATOR AND PROXIMITY SWITCH CONTAINING THE OSCILLATOR

[75] Inventor: Peter Heimlicher, Fribourg, Switzerland

[73] Assignee: Optosys SA, Villars-Sur-Glane, Switzerland

[ * ] Notice: This patent issued on a continued prosecution application filed under 37 CFR 1.53(d), and is subject to the twenty year patent term provisions of 35 U.S.C. 154(a)(2).

[21] Appl. No.: 08/874,251

[22] Filed: Jun. 13, 1997

[30] Foreign Application Priority Data

Jun. 13, 1996 [CH] Switzerland ............ 1482/96

[51] Int. Cl.[7] .......... H03K 17/95; H03L 1/02
[52] U.S. Cl. .......... 331/65; 331/176; 331/167; 331/66
[58] Field of Search .......... 331/176, 65, 66, 331/167

[56] References Cited

U.S. PATENT DOCUMENTS

| | | | |
|---|---|---|---|
| 4,509,023 | 4/1985 | Heimlicher | 331/176 |
| 5,043,679 | 8/1991 | Kriz et al. | 331/65 |

OTHER PUBLICATIONS

Patent Abstracts of Japan, vol. 017, No. 378, (1993) JP 5–063559.

*Primary Examiner*—Arnold Kinkead
*Attorney, Agent, or Firm*—Foley & Lardner

[57] ABSTRACT

In an oscillator comprising a resonant circuit (L, C, $R_{CU}$) and an amplifier circuit (V, $R_1$, $R_2$, $R_3$) connected as a negative resistance ($R_n$), a direct current source ($I_1$) is connected in series with the resonant circuit (L, C, $R_{CU}$). In this way, a signal ($U_{CU}$) is provided being a measure for the resistance of the oscillator circuit coil (L). By using this signal ($U_{CU}$), a control circuit ($V_1$, M; $V_2$, $V_3$, M) controls the negative resistance ($R_n$) inversely proportional to the resistance ($R_{CU}$) of the oscillator circuit coil (L). This affords a simple stabilization of the temperature behavior of the oscillator circuit (L, C, $R_{CU}$) and allows the low price manufacture of inductive proximity switches having a great switching distance which function safely in a broad temperature range.

24 Claims, 3 Drawing Sheets

TEMPERATURE STABILIZED OSCILLATOR AND PROXIMITY SWITCH CONTAINING THE OSCILLATOR

BACKGROUND OF THE INVENTION

1. Field of the Invention

The present invention is related to a temperature stabilized oscillator comprising a resonant or oscillator circuit and an amplifier circuit connected as a virtual negative resistance. The invention further refers to a proximity switch containing this new temperature stabilized oscillator.

Oscillators that contain an LC resonant circuit are for example used in inductive proximity switches, the approach of a so-called standard measuring plate affecting the behavior of the oscillation produced by the oscillator. For example, the amplitude of the output signal of the oscillator or the start point of the oscillation will change, and these changes can control a threshold detector that will produce a useful output signal of the proximity switch.

The major drawback of commercialized inductive proximity switches is their relatively small switching distance. This switching distance cannot be increased since the dependence on temperature of the oscillator resonant circuit combination which is used will lead to a normally unacceptably high temperature coefficient when the switching distance is increased.

FIG. 1a shows the behavior of the relative oscillator circuit quality factor $Q/Q_0$ as a function of the distance S (switching distance) of the standard measuring plate of an inductive proximity switch. When the distance increases, the usable change $(Q_0-Q)$ of the oscillator circuit quality factor Q brought about by the standard measuring plate decreases rapidly to a very small value with respect to the undamped oscillator circuit quality factor $Q_0$. If the normal working range is selected such that, for a given switching distance, the relative oscillator circuit quality factor is 50% (working point A), the curve of FIG. 1a shows that the influence of the standard measuring plate on the relative oscillator circuit quality factor will be reduced to about 3% when the distance is three times greater (working point B).

The influence of the environmental temperature T on the relative oscillator circuit quality factor is represented in FIG. 1b which shows that the relation $Q/Q_0$ decreases with increasing temperature. A comparison with FIG. 1a shows that, when the switching distance becomes greater, the influence of the temperature on $Q/Q_0$ becomes rapidly greater than the change effected by the standard measuring plate. This temperature influence is caused for its major part by the temperature dependence of the resistance of the oscillator circuit coil.

2. Description of the Prior Art

A coil arrangement having a small dependence on temperature of the quality factor is known from DE-A-1,589, 826. The compensation of the temperature of the quality factor of the coil is achieved by connecting the coil as a primary winding of a transformer whose secondary winding is short-circuited. The specific resistance of the conducting material of the secondary winding has a temperature dependence of the same sign as that of the primary winding conducting material. The coupling factor as well as the ratio of the ohmic winding resistance to the inductive resistance of this winding is selected such that the quality factor at the connecting ends of the primary winding has a smaller dependency on temperature than the quality factor of the primary winding alone. However, this quality factor compensation calls for a second, shorted winding, connected as the secondary winding of a transformer, and the compensation, which is not a total one, is paid for with a relatively high loss of the quality factor.

The document EP-A-0,070,796 discloses a process wherein the dependence on temperature of the resistance of the oscillator circuit coil is used to compensate for the bad temperature behavior, caused by this very influence, of the oscillation amplitude of the oscillator circuit excited by a generator. A voltage proportional to the resistance of the oscillator circuit coil is connected to the oscillator circuit. The generator produces a constant alternating current through the resistance of the coil having the same frequency as that of the oscillator circuit. This method achieves until now the greatest switching distances.

This method requires a bifilar coil for obtaining the desired compensation of the temperature dependency. This kind of coil, however, has the disadvantage that one or two additional wires have to be connected. Additional costs are thus raised during the manufacture of the coil as well as during its connection to the electronic circuit. Furthermore, the automatic manufacture of the coil and its connections becomes very difficult.

SUMMARY OF THE INVENTION

The major and most important object of the invention is to provide an oscillator as outlined above which allows, without having the drawbacks discussed above, an effective compensation for the influences of the temperature dependency of the resistance of the oscillator circuit coil on the oscillation characteristics of the oscillator circuit, thus allowing a simple and low cost manufacture of inductive proximity switches having great switching distances.

The oscillator according to the invention comprises a current source that is connected in series to the oscillator circuit for providing a signal being a measure for the resistance of the oscillator circuit coil. The oscillator further comprises a control circuit that makes the virtual negative resistance substantially inversely proportional to the resistance of the oscillator circuit coil by means of said signal.

By sensing the signal which is a measure for the resistance of the oscillator circuit coil, by means of the current source, and the control of the negative resistance, in using this signal, inversely proportional to the resistance of said coil, the oscillating condition of the oscillator circuit has become independent of the resistance of the oscillator circuit coil and thus substantially independent from temperature. This results in a stabilization of the temperature behavior of the start point of the circuit oscillation and thus in a stable oscillator and a simple proximity switch having a great switching distance and which functions in a large temperature range.

Further objects, advantages and features of the invention will become understood from the following description of embodiments which are shown in the drawing. This description is illustrative only and not to be construed as to limit the invention in any way.

DETAILED DESCRIPTION OF THE INVENTION

Figure 1A:
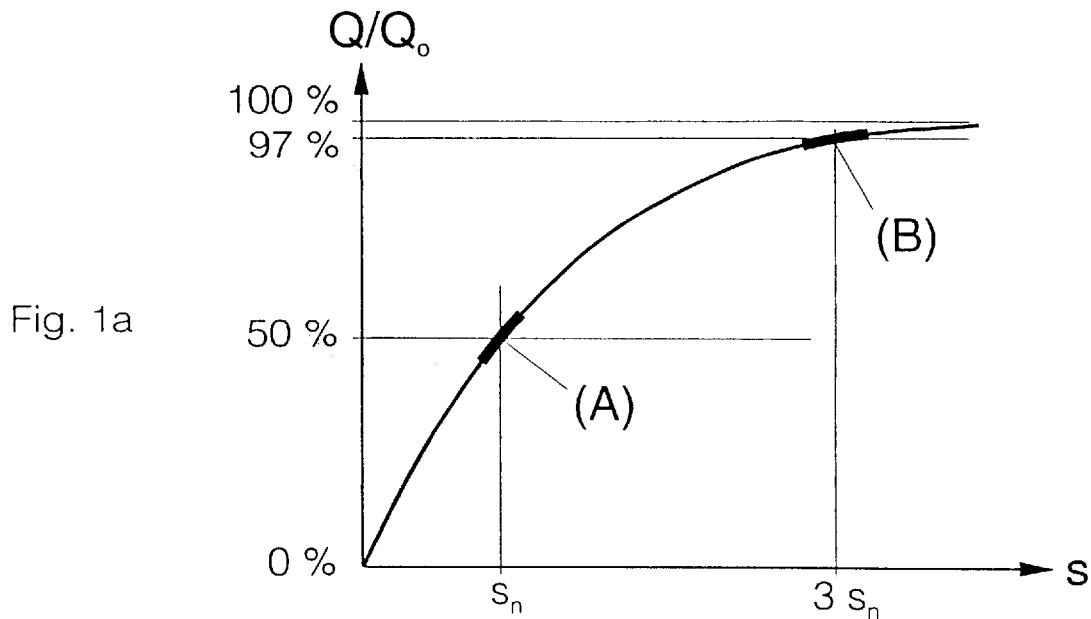
FIG. 1a shows the behavior of the relative quality factor of an inductive proximity switch in function of the switching distance.
Figure 1B:
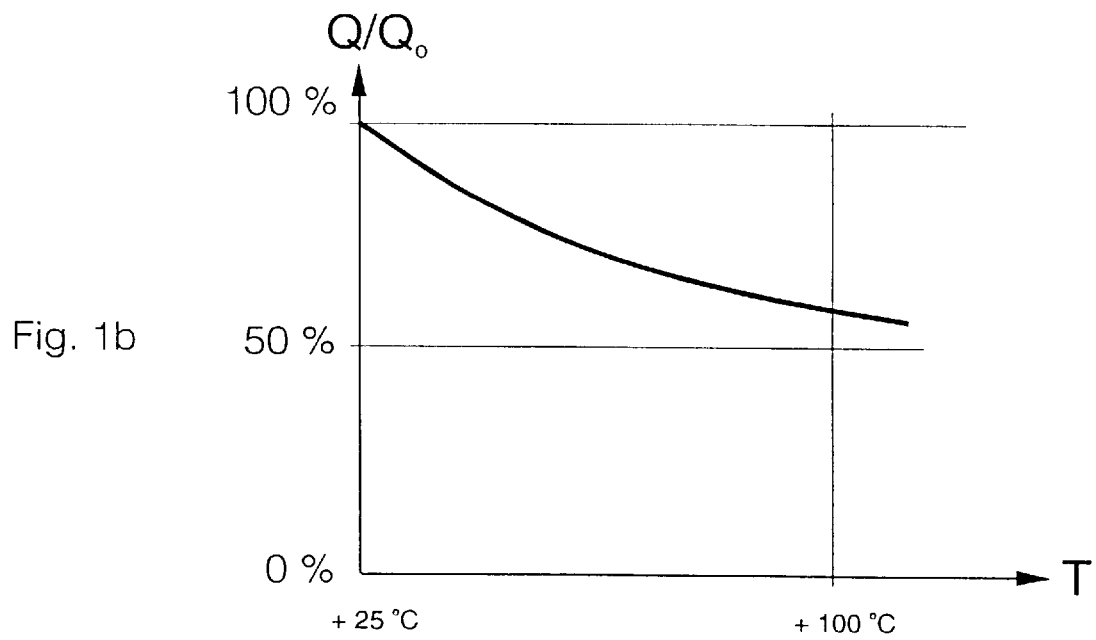
FIG. 1b shows the behavior of the relative quality factor of an inductive proximity switch in function of the temperature.
Figure 2:
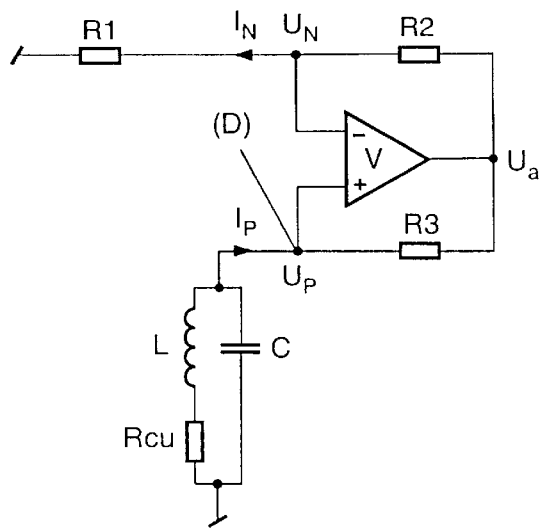
FIG. 2 is the circuit diagram of an oscillator having an LC resonant cycle connected in parallel to a virtual negative resistance.

FIG. 2 shows the circuit diagram of an oscillator having an LC resonant circuit connected in parallel to a virtual negative resistance. The oscillator according to FIG. 2 is constructed in a known manner and comprises an oscillator circuit formed by the coil L (having an inductivity L) and the capacitor C (having a capacity C), the copper resistance $R_{CU}$ of the oscillator circuit coil L, and an amplifier V connected as a negative resistor, three resistors $R_1$, $R_2$ and $R_3$ determining the virtual negative resistance $R_n$ at point (D) being provided. The ohmic resistance of the respective resistors $R_i$ is designated as $R_i$ for sake of simplicity.

The resistor $R_1$ is connected between mass and the inverting input (input N) of the amplifier V. The resistor $R_2$ is connected between the inverting input of amplifier V and its output. Resistor $R_3$ is connected between the non-inverting input (input P) of amplifier V and its output. The resonant circuit L, C, $R_{CU}$ is connected between the non-inverting input of amplifier V and mass.

The application of the first Kirchhoff law to the inputs N and P of amplifier V gives the following equations for the currents $I_N$, $I_P$ and the voltages $U_N$, $U_P$ and $U_a$ (output voltage of amplifier V) of FIG. 2:

$$-I_N+(U_a-U_N)/R_2=0$$

$$I_P+(U_a-U_P)/R_3=0$$

Furthermore:

$$U_N=U_P$$

$$U_N-I_N*R_1=0$$

It follows therefrom:

$$I_N=(-R_3/R_2)*I_P$$

$$U_P+(R_1*R_3/R_2)*I_P=0$$

and thus $$R_n=-R_1*R_3/R_2 \quad (1).$$

The resonant circuit comprising L, C and $R_{CU}$ has the equivalent resonant resistance $R_P$ (not shown) at resonance. It holds that $$R_P=L/(C*R_{CU}) \quad (2).$$

The oscillating condition for the oscillator according to FIG. 2 is $$|R_P| \geq |R_n| \quad (3).$$

The circuit oscillates with the frequency $F_{osc}$ (for example in the order of a few hundred kHz).

The resistance $R_{CU}$ of the wire material of coil L has a relatively high positive temperature coefficient that influences according to equations (2) and (3) the start point and the break point of the oscillation. In proximity switch oscillators however, the start or break point of the oscillation, respectively, is determined by a processing circuit in a manner known per se, as a result of the approach of a standard measuring plate and used as a switching point for the proximity switch. Any temperature influence whatsoever on this switching point is therefore undesired. The major temperature influence stems from the resistance $R_{CU}$ of the oscillator circuit coil L in known oscillators.

Figure 3:
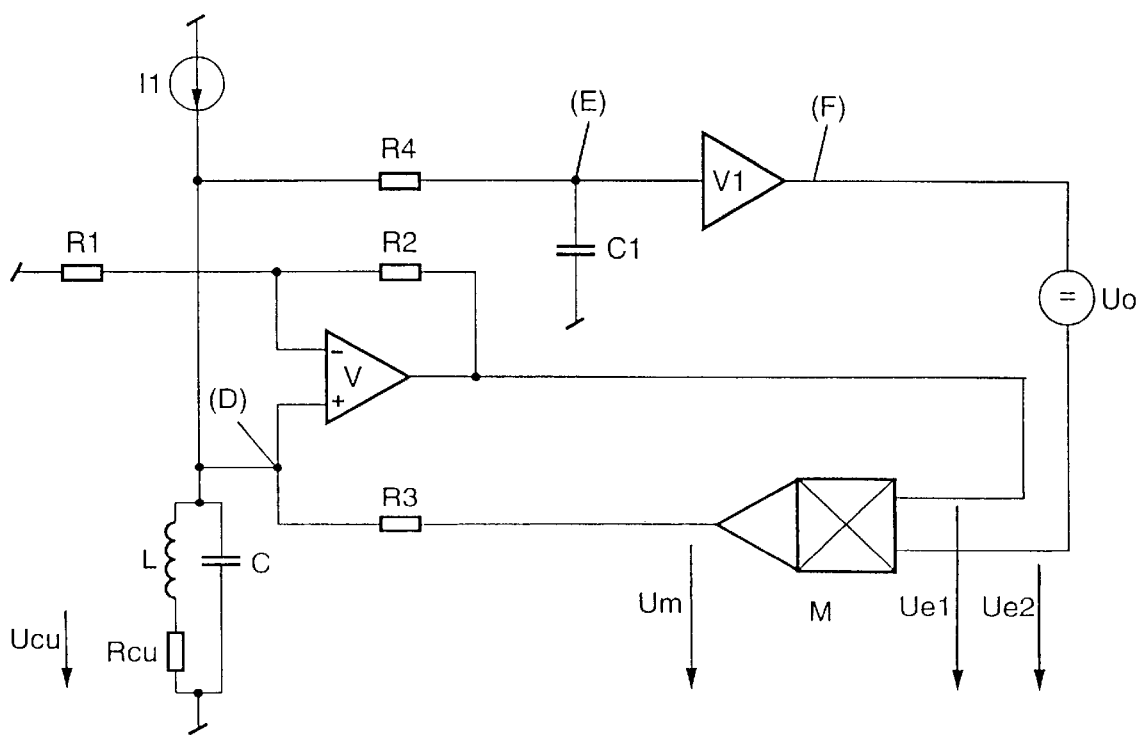
FIG. 3 is the circuit diagram of an oscillator according to a first embodiment of the invention.

FIG. 3 shows the circuit diagram of an oscillator according to a first embodiment of this invention. The constant current source $I_1$ is used for determining the temperature dependent copper resistance $R_{CU}$ of the oscillator circuit coil L. This source is connected between mass and the non-inverting input of amplifier V and in series with the oscillator circuit L, C, $R_{CU}$. The current source $I_1$ may also be a source of a pulsating direct current or even of a low frequency alternating current (whose frequency is much lower than $F_{osc}$). The source supplies a measuring current $I_1$ that causes a voltage drop $U_{CU}$ over the resistance $R_{CU}$ of the oscillator circuit coil L:

$$U_{CU}=R_{CU}*I_1 \quad (4).$$

Its impedance is selected so high that the resonant circuit L, C, $R_{CU}$ is essentially not damped. The alternating voltage portion is first filtered out of the voltage drop $U_{CU}$ by means of the low pass filter formed by capacitor $C_1$ and resistor $R_4$. The constant voltage (d. c.) portion at point (E) is amplified in a non-inverting DC amplifier $V_1$ by the factor G. The DC voltage $U_{V1}$ that is proportional to the copper resistance $R_{CU}$ is available at the output (F) of amplifier $V_1$:

$$U_{V1}=R_{CU}*I_1*G \quad (5).$$

According to FIG. 3, a constant voltage source $U_0$ is connected between the output (F) of amplifier $V_1$ and one of the inputs of a multiplier M. In order to simplify the formula, the constant k is defined as follows:

$$k=R_1/(R_1+R_2) \quad (6)$$

The voltage source $U_0$ is used to add a constant voltage $k*U_0$ to the voltage $U_{V1}$ at (F). The sum of these two voltages is named $U_{e2}$. Instead by the voltage source $U_0$ connected in series, the desired voltage may of course be brought in by an adding circuit.

Furthermore, the multiplier M already mentioned is connected between the output of the amplifier V and the resistor $R_3$; this current path contributes according to equation (1) to the virtual negative resistance $R_n$ at (D). The multiplier calculates $U_m$ according to (7), wherein $U_{e1}$ is the output voltage of the amplifier V:

$$U_m=U_{e1}*U_{e2}/U_0 \quad (7).$$

$U_0$ is the reference voltage of the multiplier M.

The virtual negative resistance $R_n$ at (D) can again be calculated by the application of the first Kirchhoff law to the inputs N and P of the amplifier V (the currents $I_N$, $I_P$ and the voltages $U_N$, $U_P$ correspond to the currents and voltages shown in FIG. 2 and are not represented, for sake of simplicity, in FIG. 3):

$$-I_N + (U_{e1} - U_N)/R_2 = 0$$

$$I_P + (U_m - U_P)/R_3 = 0.$$

Furthermore:

$$U_N = U_P$$

$$U_N - I_N * R_1 = 0$$

It follows therefrom:

$$U_{e1} = I_N * (R_1 + R_2) = U_P/k$$

$$I_P = (U_P - U_{e1} * U_{e2}/U_0)/R_3$$

$$= [U_P - (U_P/k) * (U_{V1} + k * U_0)/U_0]/R_3$$

$$= -(U_P * U_{V1})/(k * U_0 * R_3)$$

$$U_P = [-(k * U_0 * R_3)/U_{V1}] * I_P$$

and then $$R_n = -k * R_3 * U_0/U_{V1} \quad (8)$$

and, equation (5) inserted into (8):

$$R_n = -(k * R_3 * U_0)/(R_{CU} * I_1 * G). \quad (9)$$

The virtual negative resistance $R_n$ is thus inversely proportional to the copper resistance $R_{CU}$ of the oscillator circuit coil L, and the dependency on temperature of the oscillating behavior of the oscillator according to FIG. 2, caused by $R_{CU}$, is compensated in an ideal manner. By means of the evaluation of the copper resistance $R_{CU}$ of the oscillator circuit coil L and the feedback of the signal $U_{CU}$ or $U_{V1}$, respectively, the oscillating condition for the oscillator (see equation 3) becomes namely independent of $R_{CU}$ and is thus substantially temperature independent. The circuit therefore achieves a compensation of the temperature coefficient influence of the resistance $R_{CU}$ of the oscillator circuit coil L on the starting point of the oscillation of resonant circuit L, C, $R_{CU}$ without the necessity of a bifilar coil. The oscillator circuit coil L is a simple coil having one winding and two connections, without special requirements regarding the coil.

The control of the virtual negative resistance $R_n$ inversely proportional to the copper resistance $R_{CU}$ of the oscillator circuit coil L and thus the temperature compensation of the oscillator is achieved in that the output voltage $U_{e1}$ of the amplifier V is multiplied by a factor which is a linear function of the resistance $R_{CU}$ of the coil L.

This multiplication and the generation of the appropriate factor can advantageously be obtained by the low-price control circuit according to FIG. 3. Other embodiments of the control circuit are of course possible. For example, the multiplier M which is shown may be replaced by a time division device, or the signal may first be digitalized and the multiplication be effected by a multiplying digital-analog-transformer. The whole control may also be effected in a purely digital manner, for example by a digital signal processor.

The current source $I_1$ is preferably derived from the voltage source $U_0$ or vice versa. This measure achieves that (according to equation (9): $U_0$ in the numerator, $I_1$ in the denominator) the negative resistance $R_n$ is not negatively affected by a possible instability of the voltage source $U_0$ or the current source $I_1$. Thus, there is no necessity to stabilize the voltage source $U_0$ and the current source $I_1$.

The voltage source $U_0$ may also be left out. This will result in that the virtual negative resistance $R_n$ is not exactly inversely proportional to the copper resistance $R_{CU}$ of the oscillator circuit coil L. The temperature compensation will then be somewhat less perfect.

When the oscillator according to this invention is used in a proximity switch, the temperature compensated starting or break point of the oscillation, respectively, is detected on the approach of a standard measuring plate in a manner known per se by an evaluating circuit, for example a threshold detector, and is used as a switching point for the proximity switch.

The copper resistance $R_{CU}$ of the oscillator circuit coil L amounts typically to a few ohms only, and the current $I_1$ available in practice is in the order of 1 mA. The usable voltage $U_{CU}$ is therefore some mV only. It is difficult to amplify such a low voltage with the required precision. Before all, the offset voltage of the amplifier $V_1$ is disturbing. To avoid this problem, the amplifier $V_1$ may be constructed according to the known principle of the chopper amplifier.

Figure 4:
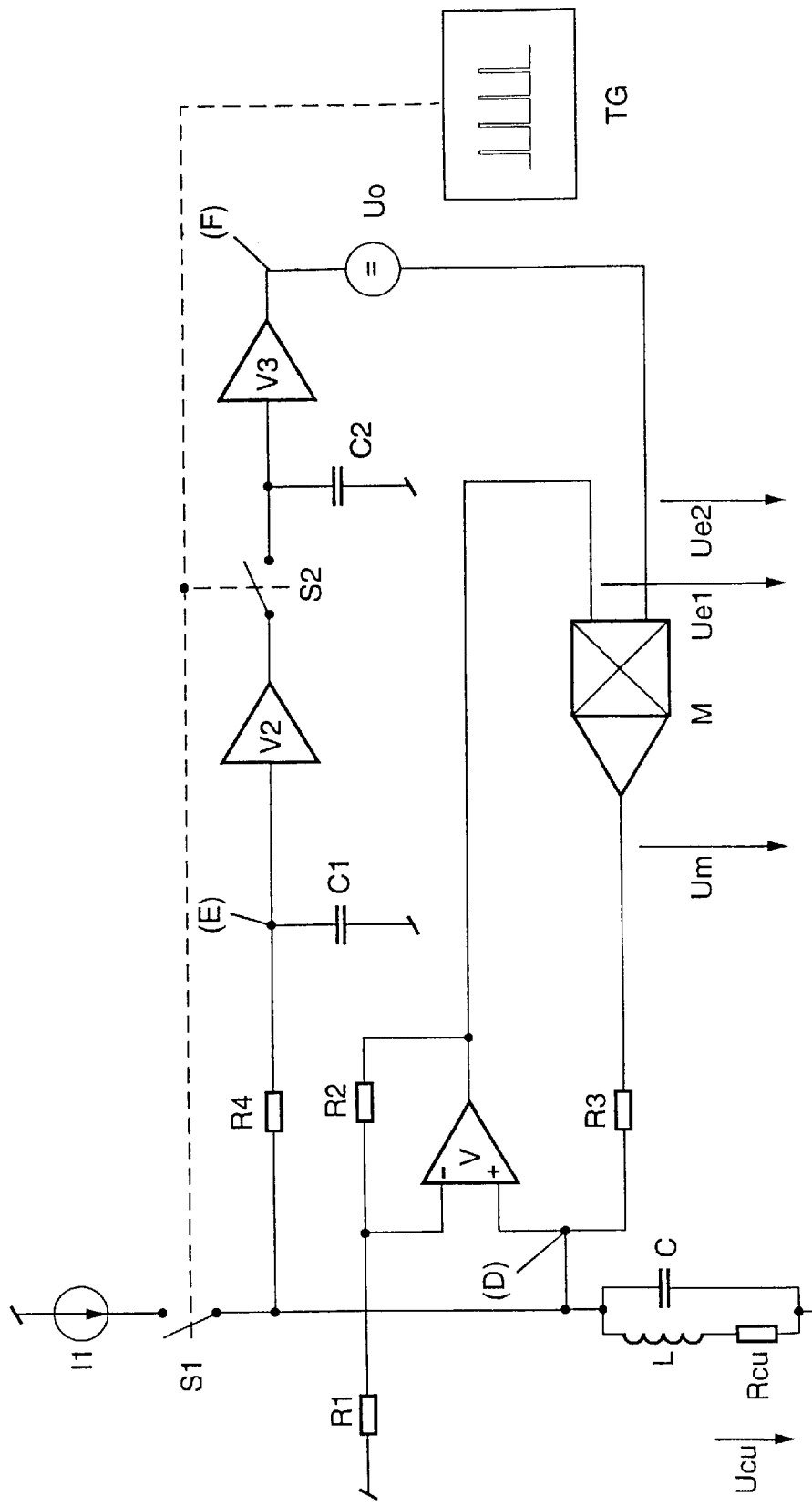
FIG. 4 is the circuit diagram of an oscillator according to another embodiment of the invention.

FIG. 4 shows the wiring circuit of an oscillator according to another embodiment of this invention. Instead of constructing the amplifier $V_1$ as a chopper amplifier, a sample-and-hold circuit is used for amplifying the voltage drop $U_{CU}$. The current source $I_1$ is clocked by the clock generator TG and the switch $S_1$ with a frequency $F_{TG}$ that is in the order of some Hz and thus substantially lower than $F_{osc}$. The duty ratio of the clock generator TG can be selected low for the reduction of the current used by the current source $I_1$.

The alternating voltage component of the voltage at point (E) is amplified in the non-inverting alternating voltage amplifier $V_2$. Then, the direct voltage fraction is restored by means of the sample-and-hold circuit consisting of the switch $S_2$, the holding capacitor $C_2$ and the voltage follower $V_3$. The offset voltage of the amplifier $V_3$ remains without influence with respect to the usable voltage $U_{CU}$ already amplified in amplifier $V_2$.

I claim:

1. A temperature stabilized oscillator, including a resonant circuit (L, C, $R_{CU}$) having a coil with a temperature dependent copper resistance ($R_{CU}$) and an amplifier circuit (V, $R_1$, $R_2$, $R_3$) connected as a virtual negative resistance ($R_n$), said oscillator comprising:

a current source ($I_1$) connected in series with the resonant circuit (L, C, $R_{CU}$) in order to provide across the coil of the resonant circuit a ($U_{CU}$) voltage which is directly proportional to the resistance ($R_{CU}$) of the coil (L) of the resonant circuit; and a control circuit ($V_1$, M; $V_2$, $V_3$, M) which in respect to said voltage makes the virtual negative resistance ($R_n$) substantially inversely proportional to the resistance ($R_{CU}$) of the coil (L) of the resonant circuit, characterized in that the control circuit ($V_1$, M; $V_2$, $V_3$, M) adjusts an output voltage ($U_{e1}$) of the amplifier circuit (V, $R_1$, $R_2$, $R_3$) based upon voltage ($U_{e2}$) that is a linear function of said voltage ($U_{CU}$).

2. The oscillator according to claim 1, characterized in that the current source ($I_1$) is a direct current source, a pulsating direct current source or a low frequency alternating current source.

3. The oscillator according to claim 1 or 2, characterized in that the control circuit ($V_1$, M; $V_2$, $V_3$, M) multiplies the output voltage ($U_{e1}$) of the amplifier circuit (V, $R_1$, $R_2$, $R_3$) with a voltage that is a linear function of said signal ($U_{CU}$).

4. The oscillator according to claim 1, characterized in that the resonant circuit (L, C, $R_{CU}$) is connected to one input of a first amplifier (V), and a first resistor ($R_1$) is connected to the other input of said first amplifier (V), a second resistor ($R_2$) is connected between said other input of the first amplifier (V) and its output, a third resistor ($R_3$) is inserted between said one input of said first amplifier (V) and the control circuit ($V_1$, M; $V_2$, $V_3$, M), and that said one input of the first amplifier (V) and its output are connected to the control circuit ($V_1$, M; $V_2$, $V_3$, M).

5. The oscillator according to claim 4, characterized in that the one input of said first amplifier (V) is connected through a further amplifier ($V_1$; $V_2$) to one input of a multiplier (M) whose other input is connected to the output of said first amplifier (V) and whose output is connected through said third resistor ($R_3$) with said one input of the first amplifier (V).

6. The oscillator according to claim 5, characterized in that a low pass filter ($R_4$, $C_1$) is connected between the one input of the first amplifier (V) and the input of said further amplifier ($V_1$; $V_2$).

7. The oscillator according to claim 5 or 6, characterized in that a voltage source ($U_0$) is connected between the output of said further amplifier ($V_1$; $V_2$) and the input of said multiplier (M) for adding a voltage.

8. The oscillator according to claim 7, characterized in that the voltage source ($U_0$) adds a constant voltage $k*U_0$ to the output voltage ($U_{V1}$) of said further amplifier ($V_1$; $V_2$), k being equal to $R_1/(R_1+R_2)$ and $U_0$ being the reference voltage of said multiplier (M).

9. The oscillator according to claim 7, characterized in that the current source ($I_1$) is derived from the voltage source ($U_0$) or vice versa.

10. The oscillator according to claim 5, characterized in that said further amplifier is a non-inverting direct voltage amplifier ($V_1$).

11. The oscillator according to claim 5, characterized in that said further amplifier is a chopper amplifier ($V_1$).

12. The oscillator according to claim 5, characterized in that the further amplifier is constructed as a non-inverting alternating current amplifier ($V_2$), a clock generator (TG) and a switch ($S_1$) for clocking the current source ($I_1$) being provided as well as a sample-and-hold circuit ($S_2$, $C_2$, $V_3$) for restoring the direct current component of the signal amplified by the alternating current amplifier ($V_2$).

13. A proximity switch, comprising:
a temperature stabilized oscillator circuit, including a resonant circuit having a coil with a temperature dependent copper resistance ($R_{CU}$) and an amplifier circuit connected as a virtual negative resistance, said oscillator circuit comprising;
a current source connected in series with the resonant circuit in order to provide across the coil of the resonant circuit a voltage ($U_{CU}$) which is directly proportional to the resistance of the coil of the resonant circuit; and
a control circuit which in response to said voltage makes the virtual negative resistance substantially inversely proportional to the resistance of the coil of the resonant circuit, characterized in that the control circuit adjusts an output voltage ($U_{e1}$) of the amplifier circuit based upon a voltage ($U_{e2}$) that is a linear function of said voltage ($U_{CU}$).

14. A proximity switch according to claim 13, further comprising an evaluating circuit for sensing the start and break point of the oscillation generated by the oscillator in function of the approach of a standard measuring plate.

15. A temperature stabilized oscillator, including a resonant circuit (L, C, $R_{CU}$) having a coil with a temperature dependent copper resistance ($R_{CU}$) and an amplifier circuit (V, $R_1$, $R_2$, $R_3$) connected as a virtual negative resistance ($R_n$), said oscillator comprising:
a current source ($I_1$) connected in series with the resonant circuit (L, C, $R_{CU}$) in order to provide a signal ($U_{CU}$) which is a measure for the resistance ($R_{CU}$) of the coil (L) of the resonant circuit; and
a control circuit ($V_1$, M; $V_2$, $V_3$, M) which by using said signal makes the virtual negative resistance ($R_n$) substantially inversely proportional to the resistance ($R_{CU}$) of the coil (L) of the resonant circuit, characterized in that the control circuit ($V_1$, M; $V_2$, $V_3$, M) multiplies the output voltage ($U_{e1}$) of the amplifier circuit (V, $R_1$, $R_2$, $R_3$) with a voltage that is a linear function of said signal ($U_{CU}$).

16. A temperature stabilized oscillator, including a resonant circuit (L, C, $R_{CU}$) having a coil with a temperature dependent copper resistance ($R_{CU}$) and an amplifier circuit (V, $R_1$, $R_2$, $R_3$) connected as a virtual negative resistance ($R_n$), said oscillator comprising:
a current source ($I_1$) connected in series with the resonant circuit (L, C, $R_{CU}$) in order to provide a signal ($U_{CU}$) which is a measure for the resistance ($R_{CU}$) of the coil (L) of the resonant circuit; and
a control circuit ($V_1$, M; $V_2$, $V_3$, M) which by using said signal makes the virtual negative resistance ($R_n$) substantially inversely proportional to the resistance ($R_{CU}$) of the coil (L) of the resonant circuit, characterized in that the resonant circuit (L, C, $R_{CU}$) is connected to one input of a first amplifier (V), a first resistor ($R_1$) is connected to the other input of said first amplifier (V), a second resistor ($R_2$) is connected between said other input of the first amplifier (V) and its output, a third resistor ($R_3$) is inserted between said one input of said first amplifier (V) and the control circuit ($V_1$, M; $V_2$, $V_3$, M), and that said one input of the first amplifier (V) and its output are connected to the control circuit ($V_1$, M; $V_2$, $V_3$, M).

17. The oscillator according to claim 16, characterized in that the one input of said first amplifier (V) is connected through a further amplifier ($V_1$; $V_2$) to one input of a multiplier (M) whose other input is connected to the output of said first amplifier (V) and whose output is connected through said third resistor ($R_3$) with said one input of the first amplifier.

18. The oscillator according to claim 17, characterized in that a low pass ($R_4$, $C_1$) is connected between the one input of the first amplifier (V) and the input of said further amplifier ($V_1$; $V_2$).

19. The oscillator according to claim 17 or 18, characterized in that a voltage source ($U_0$) is connected between the output of said further amplifier ($V_1$; $V_2$) and the input of said multiplier (M) for adding a voltage.

20. The oscillator according to claim 19, characterized in that the voltage source ($U_0$) adds a constant voltage $k*U_0$ to the output voltage ($U_{V1}$) of said further amplifier ($V_1$; $V_2$), k being equal to $R_1/(R_1+R_2)$ and $U_0$ being the reference voltage of said multiplier (M).

21. The oscillator according to claim 19, characterized in that the current source ($I_1$) is derived from the voltage source ($U_0$) or vice versa.

22. The oscillator according to claim 17, characterized in that said further amplifier is a non-inverting direct voltage amplifier ($V_1$).

23. The oscillator according to claim 17, characterized in that said further amplifier is a chopper amplifier ($V_1$).

24. The oscillator according to claim 17, characterized in that the further amplifier is constructed as a non-inverting alternating current amplifier ($V_2$), a clock generator (TG) and a switch ($S_1$) for clocking the current source ($I_1$) being provided as well as a sample-and-hold circuit ($S_2$, $C_2$, $V_3$) for restoring the direct current component of the signal amplified by the alternating current amplifier ($V_2$).

* * * * *